United States Patent [19]

Hastings

[11] 4,037,167
[45] July 19, 1977

[54] AUTOMATIC GAIN CONTROL AMPLIFIER

[76] Inventor: Kingsley N. Hastings, 1590 York Ave., New York, N.Y. 10028

[21] Appl. No.: 725,153

[22] Filed: Sept. 20, 1976

Related U.S. Application Data

[62] Division of Ser. No. 604,175, Aug. 13, 1975, abandoned.

[51] Int. Cl.$^2$ .............................................. H03G 3/30
[52] U.S. Cl. ..................................... 330/29; 325/319; 325/408; 330/38 M; 330/145
[58] Field of Search ...................... 325/319, 408, 413; 330/25, 28, 29, 38 M, 145

[56] References Cited

U.S. PATENT DOCUMENTS 3,447,094  5/1969  Beres ........................................ 330/29

Primary Examiner—Rudolph V. Rolinec
Assistant Examiner—Lawrence J. Dahl
Attorney, Agent, or Firm—Birch, Stewart, Kolasch & Birch

[57] ABSTRACT

An AM converter and AGC amplifier are described for use either separately or in combination in a radio receiver. The AGC amplifier includes a semiconductor device directly coupled to the amplifier input for receiving automatic gain control signals. The AM converter includes a single mixer transistor directly coupled to both an RF amplifier and local oscillator. The converter circuit provides attenuation of the oscillator signal by up to 60 d.b. relative to the R.F. signal, greatly reducing the necessary I.F. filtering. Both the converter and AGC circuits are fabricated on integrated circuit chips.

3 Claims, 3 Drawing Figures

4,037,167

AUTOMATIC GAIN CONTROL AMPLIFIER

This is a Division of application Ser. No. 604,175 filed Aug. 13, 1975, now abandoned.

BACKGROUND OF THE INVENTION

1. Field of the Invention

The present invention relates to integrated circuits for use in radio receivers. More specifically, the present invention relates to AM converter (amplitude modulated) and AGC (automatic gain control) circuitry suitable for integrated circuit fabrication.

2. Description of Prior Art

To date it has proven inefficient to use integrated circuits (IC's) in lower cost radios. This is due in part to problems involved in moving from discrete components to integrated circuits in tuned multi-function circuits. The tuned circuits cannot yet be made in practical chip form and thus the required number of these elements has not thus far been reduced. I.C. radio tuners today are characterized by large numbers of transistors in the IC and large numbers of connections to the IC chip compared to discrete circuitry. IC's have high tooling costs and high production costs in small volume production. In high volume production runs, on the other hand, the costs are very low. At present, the versatility of IC circuitry has been limited, thus restricting large volume runs of a circuit for low-cost radio tuners.

In short at present low voltage AM radio tuner circuitry suitable for integration in semiconductors has little advantage over discrete circuitry approaches. Present circuitry requires either a large number of components external to the IC, or multiple integrated amplifiers with a large number of connections to the IC, in order to realize the necessary functions of oscillation, mixing, amplifying, automatic gain control and I.F. filtering.

SUMMARY OF INVENTION

It is, therefore, an object of this invention to provide new and novel circuitry for integration for radios and other electronic equipment.

It is another object of this invention to provide a new and novel automatic gain controlled (AGC'd) amplifier for integrated circuit use which requires a minimum of external pin connections and which can be controlled by an unfiltered or filtered AGC signal.

It is still another object of this invention to provide simple AM radio converter circuitry suitable for semiconductor integration.

It is a further object of this invention to provide circuitry including a stable local oscillator.

It is another object of this invention to provide new and novel automatic gain controlled mixer.

It is aother object of this invention to provide circuitry for a new and novel converter which includes a radio frequency amplifier of high sensitivity.

It is a further object of the present invention to provide new and novel circuitry for reducing the required intermediate frequency/filtering (IF) by electronically attenuating the oscillator signal relative to the I.F. signal before being applied to the I.F. filter.

Further, it is another objective to provide all of the necessary functions of AM conversion utilizing as little as four connections to the IC chip.

BRIEF DESCRIPTION OF DRAWINGS

These and other objects of the present invention and the attendant advantages thereof will become more fully apparent with reference to the following description of the drawings wherein:

Referring to FIG. 1 there is shown an electronic amplifier circuit with AGC capability. Signals are fed to the circuit through tuned circuit T1 to the base of transistor amplifier Q2. The amplified signal is taken off the collector resistor R3 and sent to the load which can be tuned or untuned circuit. Bias current is provided through bias resistor R4.

Capacitor C5 connects the input and bias to ground AC wise. Unfiltered AGC voltage is applied to the base of the AGC transistor Q6. When AGC voltage is off this transistor has no dynamic influence on the circuit. As Q6 is turned on it draws current through T1, R4 and R3. When R4 is a large value resistor (greater than 100,000 ohms) a very slight current through it will reduce the bias voltage at the base of Q2, reducing the gain. With R4 much larger than R3, Q2 will be fully off when the Q6 collector current is still small (Microampere range). At this small operating current Q6 acts as an attenuator to any AC signals on its base. Any studio still on the collector of Q6 is shorted through T1 to filter capacitor C5 and to ground. The amplifier here shown as Q2 can consist of one or more transistors, the additional elements being connected in either darlington or emmiter follower configuration.

Figure 2:
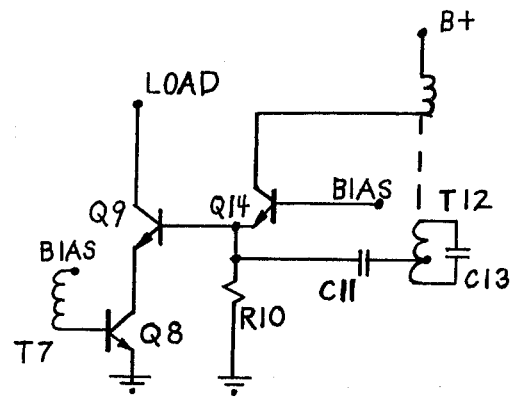
FIG. 2 illustrates the converter of the present invention.

Referring to the AM converter of FIG. 2, Q8 acts as an RF amplifier, Q9 as a mixer, and Q14 as a local oscillator. The incoming RF signal is applied through transformer T7 to the base of Q8. The load for Q8 is the emitter input impedance of the mixer, Q9. Q9 is a common base amplifier with the base grounded through C11 at the R.F. frequency, thus providing a low impedance load for Q8. The local oscillator signal is provided to the mixer by oscillator, Q14. T12 and C13 form the resonant and feedback oscillator circuits. R10 is the emitter resistor for Q14. C11 functions to inject the oscillator signal into the emitter of Q14 and the base of the mixer, Q9.

The amplification by Q9 of the R.F. input and the oscillator input is different due to their different input impedances. Amplification is proportional to the load impedance divided by the input impedance. The input impedance for the RF signal is very low due to the grounding of the base of Q9 at RF frequencies through C11. The input impedance for the oscillator signal is very high due to the high collector impedance of Q8 providing the emitter impedance of Q9. The difference in theses two input inpedances can be a ratio of over 1000 to one. Thus this unique and novel converter can provide attenuation of the oscillator signal by up to 60 db relative to the R.F. signal, greatly reducing the necessary I.F. filtering.

Other oscillator circuitry can be used, provided the oscillator signal is injected into the mixer base, and the base of the mixer is grounded to the R.F. frequency. The oscillator can also be capacitively coupled to the mixer through a capacitor by using a separate bias network to provide bias to the mixer. A resistor can be shunted across Q8, from the emitter of Q9 to ground, in order to reduce this impedance for use with some types of transistors.

Due to the novel circuit relationship in this converter, the low level noise associated with oscillators is isolated from the R.F. input amplifier by the reverse biased collector of Q8, thus providing a low noise input for high sensitivity.

Figure 1:
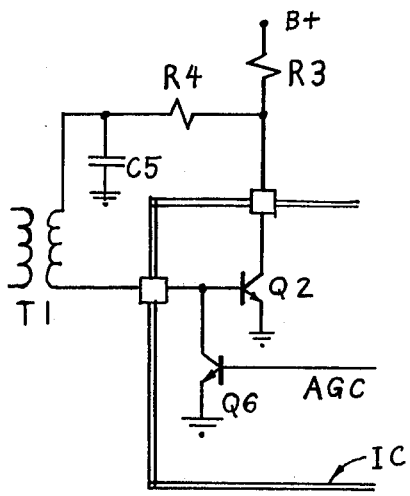
FIG. 1 illustrates an automatic gain control amplifier suitable for use in the converter of the present invention.
Figure 3:
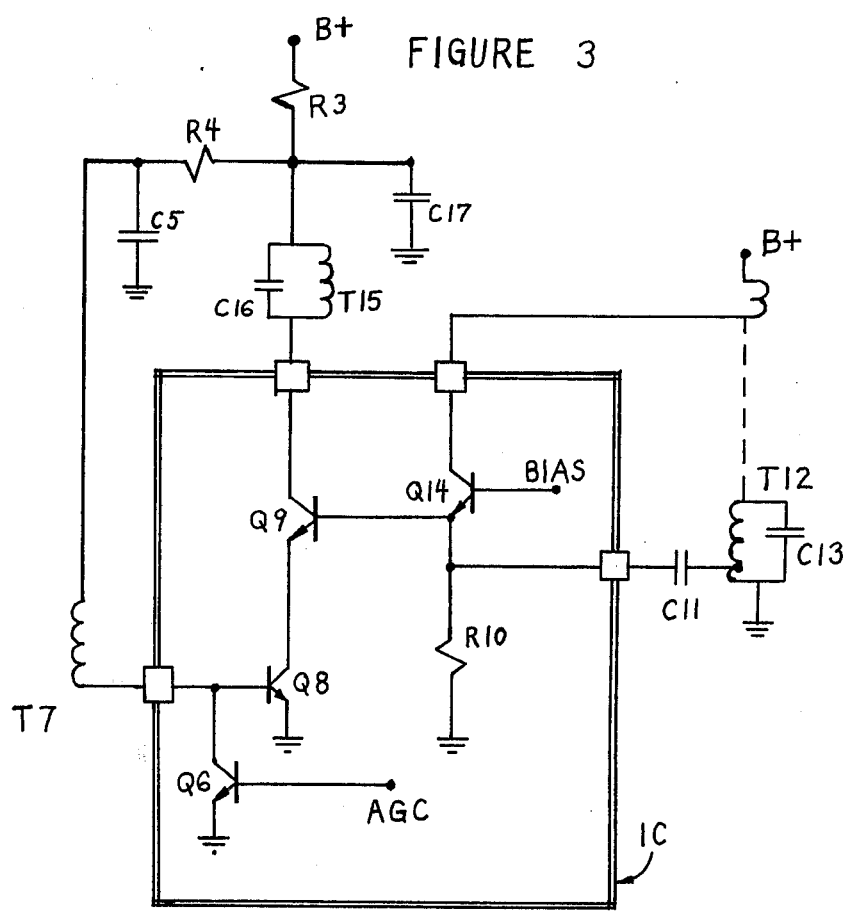
FIG. 3 illustrates the converter of FIG. 2 in combination with the amplifier of FIG. 1.

FIG. 3 illustrates the converter of FIG. 2 with the addition of the AGC techniques of FIG. 1. T15 and C16 form the I.F. filter, and C17 is an I.F. bypass capacitor. The filtered or unfiltered AGC voltage is applied to the base of Q6, turning Q6 on, and drawing current through the bias resistors R3 and R4 and the transformer T7. The voltage at the base of Q8 is reduced, reducing the current through both Q8 and Q9, thus reducing the gain.

The circuitry of the present invention may be modified as it would occur to one of ordinary skill in the art without departing from the spirit and scope of the present invention.

What is claimed is:

1. An automatic gain control amplifier comprising:
   a. at least one transistor amplifier having a base, collector, and emitter, said collector being connected to a D.C. supply voltage through a collector resistor, said emitter being connected to ground;
   b. a tuned circuit including transformer means for applying a signal of a predetermined frequency to said base;
   c. a biasing resistor coupled between said collector and said tuned circuit, said biasing resistor being much larger than said collector resistor;
   d. transistor means coupled between the base of said transistor amplifier and ground for controlling the gain of said amplifier in response to a gain control signal; and
   e. capacitor means in the base circuit of said amplifier coupled between said transformer means and ground for providing an A.C. path to ground.

2. The amplifier of claim 1 wherein said transistors are contained on an integrated circuit chip and all other circuit components are external to said chip.

3. The amplifier of claim 1 wherein means are provided for filtering said gain control signal.

* * * * *